(12) United States Patent
Sakui et al.

(10) Patent No.: US 12,419,032 B2
(45) Date of Patent: Sep. 16, 2025

(54) MEMORY DEVICE INCLUDING SEMICONDUCTOR ELEMENT

(71) Applicant: Unisantis Electronics Singapore Pte. Ltd., Singapore (SG)

(72) Inventors: Koji Sakui, Tokyo (JP); Yoshihisa Iwata, Tokyo (JP); Masakazu Kakumu, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 139 days.

(21) Appl. No.: 18/545,163

(22) Filed: Dec. 19, 2023

(65) Prior Publication Data

US 2024/0206150 A1 Jun. 20, 2024

(51) Int. Cl.
*G11C 11/00* (2006.01)
*G11C 11/404* (2006.01)
(Continued)

(52) U.S. Cl.
CPC ............ *H10B 12/20* (2023.02); *G11C 11/404* (2013.01); *G11C 11/4087* (2013.01); *G11C 11/4096* (2013.01)

(58) Field of Classification Search
CPC .. H10B 12/20; G11C 11/4087; G11C 11/4096
(Continued)

(56) References Cited

U.S. PATENT DOCUMENTS 11,917,807 B2 * 2/2024 Sakui .................... H10D 30/711
11,990,204 B2 * 5/2024 Sakui .................... G11C 11/404
(Continued)

FOREIGN PATENT DOCUMENTS

JP H02188966 A 7/1990
JP H03171768 A 7/1991
(Continued)

OTHER PUBLICATIONS

International Search Report and Written Opinion (Japanese and English Translation) in PCT/JP2022/046867, dated Feb. 13, 2023 (7 pages).
(Continued)

*Primary Examiner* — Viet Q Nguyen
(74) *Attorney, Agent, or Firm* — Crowell & Moring LLP

(57) ABSTRACT

A memory device is formed with at least one memory array, the memory array being formed with a plurality of pages and a plurality of bit lines, each page being formed with a plurality of memory cells arranged in a row direction on a substrate in a plan view, the plurality of memory cells being connected to the bit lines disposed in a column direction. Each of the memory cells included in each of the pages includes a semiconductor base material, a first impurity region and a second impurity region positioned in respective ends of the semiconductor base material, a first gate conductor layer, and a second gate conductor layer. In the memory cell, the first impurity region is connected to a source line, the second impurity region is connected to a bit line, one of the first and second gate conductor layers is connected to a word line, and the other is connected to a plate line. A page erase operation, a page write operation, and a page read operation are performed by controlling a voltage applied to each of the source line, the bit line, the word line, and the plate line. At least one of the bit lines and one of the pages are selected in the page erase operation, the page write operation, and the page read operation, and an erase operation on the memory cell connected to both the bit line and the page thus selected, a write operation of storage data of the sense amplifier circuit to the memory cell, or a read operation from the memory cell to the sense amplifier circuit is executed.

13 Claims, 12 Drawing Sheets

(51) Int. Cl.
    *G11C 11/408*     (2006.01)
    *G11C 11/4096*     (2006.01)
    *H10B 12/00*     (2023.01)

(58) Field of Classification Search
    USPC .......................................................... 365/184
    See application file for complete search history.

(56) References Cited

U.S. PATENT DOCUMENTS

| | | | | |
|---|---|---|---|---|
| 12,100,443 | B2* | 9/2024 | Sakui | G11C 16/24 |
| 12,131,773 | B2* | 10/2024 | Sakui | G11C 16/10 |
| 12,205,629 | B2* | 1/2025 | Sakui | G11C 11/401 |
| 12,277,962 | B2* | 4/2025 | Shirota | H10B 12/20 |
| 12,315,544 | B2* | 5/2025 | Sakui | G11C 11/4091 |
| 2003/0111681 | A1 | 6/2003 | Kawanaka | |
| 2008/0137394 | A1 | 6/2008 | Shimano et al. | |
| 2017/0352398 | A1* | 12/2017 | Kawamura | G11C 11/2297 |
| 2022/0208254 | A1 | 6/2022 | Sakui et al. | |
| 2022/0359521 | A1 | 11/2022 | Sakui et al. | |
| 2022/0367469 | A1 | 11/2022 | Sakui et al. | |
| 2022/0406780 | A1* | 12/2022 | Sakui | G11C 11/4091 |
| 2023/0115460 | A1* | 4/2023 | Sakui | G11C 11/4096 365/184 |
| 2023/0178145 | A1* | 6/2023 | Sakui | G11C 16/24 365/189.011 |
| 2024/0081040 | A1* | 3/2024 | Sakui | H10B 12/00 |
| 2024/0206151 | A1* | 6/2024 | Sakui | G11C 11/4096 |
| 2024/0292593 | A1* | 8/2024 | Sakui | G11C 11/404 |
| 2024/0321343 | A1* | 9/2024 | Sakui | G11C 5/063 |

FOREIGN PATENT DOCUMENTS

| | | |
|---|---|---|
| JP | 7057032 B1 | 4/2022 |
| WO | WO2022/137607 A1 | 6/2022 |
| WO | WO2022/234614 A1 | 10/2022 |
| WO | WO2022/239196 A1 | 11/2022 |

OTHER PUBLICATIONS

Takato, H., et al., "Impact of Surrounding Gate Transistor (SGT) for Ultra-High-Density LSI's", *IEEE Transactions on Electron Devices*, vol. 38, No. 3, Mar. 1991, pp. 573-578 (6 pages).

Chung, H., et al., "Novel $4F^2$ DRAM Cell with Vertical Pillar Transistor(VPT)" *2011 Proceedings of the European Solid-State Device Research Conference* (2011) (4 pages).

Wong, H.S., P., et al., "Phase Change Memory" *Proceedings of the IEEE*, vol. 98, No. 12, Dec. 2010, pp. 2201-2227 (27 pages).

Tsunoda, K., et al., "Low Power and High Speed Switching of Ti-doped NiO ReRAM under the Unipolar Voltage Source of less than 3 V" IEDM (2007) pp. 767-770, (4 pages).

Kang, W., et al., "Reconfigurable Codesign of STT-MRAM Under Process Variations in Deeply Scaled Technology" *IEEE Transactions on Electron Devices*, vol. 62, No. 6, Jun. 2015, pp. 1769-1777 (9 pages).

Ertosun, M. G., et al., "Novel Capacitorless Single-Transistor Charge-Trap DRAM 1T CT DRAM) Utilizing Electrons" *IEEE Electron Device Letters*, vol. 31, No. 5, May 2010, pp. 405-407 (3 pages).

Wan, J., et al., "A Compact Capacitor-Less High-Speed DRAM Using Field Effect-Controlled Charge Regeneration" *IEEE Electron Device Letters*, vol. 33, No. 2, Feb. 2012, pp. 179-181 (3 pages).

Ohsawa, T., et al., "Memory Design Using a One-Transistor Gain Cell on SOI", *IEEE Journal of Solid-State Circuits*, vol. 37, No. 11, Nov. 2002 (13 pages).

Shino, T., et al., "Floating Body RAM Technology and its Scalability to 32nm Node and Beyond", IEEE IEDM (2006) (4 pages).

Song, J., et al., "Design Optimization of Gate-All-Around (GAA) MOSFETs" *IEEE Transactions on Nanotechnology*, vol. 5, No. 3, pp. 186-191, May 2006 (7 pages).

Loubet, N., et al., "Stacked Nanosheet Gate-All-Around Transistor to Enable Scaling Beyond FinFET" *2017 Symposium on VLSI Technology Digest of Technical Pagers*, T230-T231, Jun. 2017 (2 pages).

Jiang, H., et al., "Experimental Investigation of Self-Heating Effect (SHE) in Multiple-Fin SOI FinFETS" *Semicond. Sci. Technol.* 29 (2014) 115021 (9 pages).

Yoshida, E., et al., "A Capacitorless 1T-DRAM Technology Using Gate-Induced Drain-Leakage (GIDL) Current for Low-Power and High-Speed Embedded Memory", *IEEE Trans. on Electron Devices*, vol. 53, No. 4, Apr. 2006, pp. 692-697 (6 pages).

Morishita, F., et al., "A Capacitorless Twin-Transistor Random Access Memory (TTRAM) on SOI" IEICE Trans. Electron., vol. E90-C, No. 4, Apr. 2007, pp. 765-771 (7 pages).

Sakui, K., et al., "Dynamic Flash Memory with Dual Gate Surrounding Gate Transistor (SGT) for Computation In Memory" *Proc. IEEE IMW*, pp. 127-128 (2021) (2 pages).

English Translation of International Search Report and Written Opinion in PCT/JP2022/046867, dated Feb. 13, 2023 (5 pages).

* cited by examiner

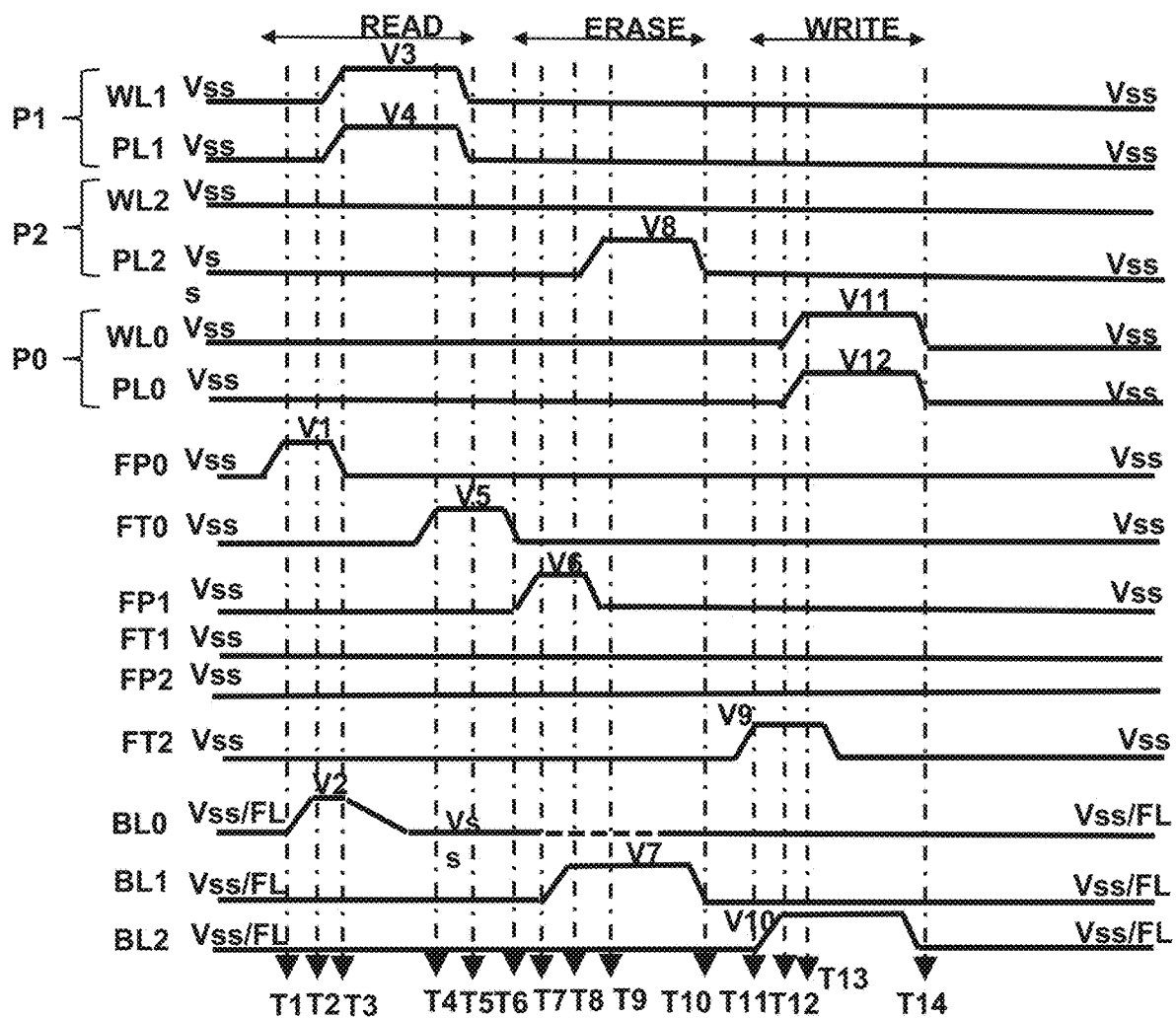

MEMORY DEVICE INCLUDING SEMICONDUCTOR ELEMENT

INCORPORATION BY REFERENCE

This application claims priority to PCT/JP2022/046867, filed Dec. 20, 2022, the entire content of which is incorporated herein by reference.

BACKGROUND OF THE INVENTION

Field of the Invention

The present invention relates to a memory device including a semiconductor element.

Description of the Related Art

Increase of integration density and performance of a memory element has been requested in recent development of large scale integration (LSI) technologies.

Increase in density and performance of a memory element has been advanced. Examples of such memory elements include a dynamic random access memory (DRAM; refer to H. Chung, H. Kim, H. Kim, K. Kim, S. Kim, K. W. Song, J. Kim, Y. C. Oh, Y. Hwang, H. Hong, G. Jin, and C. Chung: "4F2 DRAM Cell with Vertical Pillar Transistor (VPT)", 2011 Proceeding of the European Solid-State Device Research Conference, (2011), for example) in which capacitors are connected by using a surrounding gate transistor (SGT; refer to Japanese Patent Laid-open No. H02-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol.38, No. 3, pp. 573-578 (1991)) as a select transistor, a phase change memory (PCM; refer to H. S. Philip Wong, S. Raoux, S. Kim, Jiale Liang, J. R. Reifenberg, B. Rajendran, M. Asheghi and K. E. Goodson: "Phase Change Memory", Proceeding of IEEE, Vol. 98, No 12, December, pp. 2201-2227 (2010), for example) in which variable resistance elements are connected, a resistive random access memory (RRAM; refer to K. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3V", IEDM (2007), for example), and a magneto-resistive random access memory (MRAM; refer to W. Kang, L. Zhang, J. Klein, Y. Zhang, D. Ravelosona, and W. Zhao: "Reconfigurable Codesign of STT-MRAM Under Process Variations in Deeply Scaled Technology", IEEE Transaction on Electron Devices, pp. 1-9 (2015), for example) in which the orientation of magnetic spin is changed by current to change resistance.

There are also DRAM memory cells (refer to Japanese Patent Laid-open No. H03-171768, M. G. Ertosun, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, Vol. 31, No. 5, pp. 405-407 (2010), J. Wan, L. Rojer, A. Zaslavsky, and S. Critoloveanu: "A Compact Capacitor-Less High-Speed DRAM Using Field Effect-Controlled Charge Regeneration", Electron Device Letters, Vol. 35, No. 2, pp. 179-181 (2012), T. Ohsawa, K. Fujita, T. Higashi, Y. Iwata, T. Kajiyama, Y. Asao, and K. Sunouchi: "Memory design using a one-transistor gain cell on SOI", IEEE JSSC, vol. 37, No. 11, pp 1510-1522 (2002), T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond", IEEE IEDM (2006), and E. Yoshida and T. Tanaka: "A Capacitorless 1T-DRAM Technology Using Gate-induced Drain-Leakage (GIDL) Current for Low-power and High-speed Embedded Memory", IEEE IEDM, (2006)) constituted by one MOS transistor without capacitors. For example, among holes and electrons generated in a channel through an impact ionization phenomenon with source-drain current of a N-channel MOS transistor, some or all of the holes are held in the channel to write logical storage data "1". Then, the holes are removed from the channel to write logical storage data "0". In such a memory cell, "1" writing memory cells and "0" writing memory cells randomly exist for a common select word line. When on-voltage is applied to the select word line, voltage of a floating-body channel of any selected memory cell connected to the select word line largely varies due to capacitive coupling between the gate electrode and the channel. The memory cell is required to improve operation margin decrease due to variation in the floating-body channel voltage and improve data retention characteristic decrease due to removal of some of holes as signal electric charge accumulated in the channel.

There are twin-transistor MOS transistor memory elements in which one memory cell is formed in an SOI layer by using two MOS transistors (refer to, for example, US2008/0137394 A1, US2003/0111681 A1, and F. Morishita, H. Noda, I. Hayashi, T. Gyohten, M. Oksmoto, T. Ipposhi, S. Maegawa, K. Dosaka, and K. Arimoto: "Capacitorless Twin-Transistor Random Access Memory (TTRAM) on SOI", IEICE Trans. Electron., Vol. E90-c., No. 4 pp. 765-771 (2007)). In these elements, an $N^+$ layer that divides the floating-body channels of the two MOS transistors and functions as a source or a drain is formed in contact with an insulating layer on a substrate side. The $N^+$ layer electrically separates the floating-body channels of the two MOS transistors. Holes as signal electric charge are accumulated only in the floating-body channel of one of the MOS transistors. The other MOS transistor serves as a switch for reading the signal holes accumulated in the one MOS transistor. Since holes as signal electric charge are accumulated in the channel of one MOS transistor in this memory cell as well, the memory cell is required to improve operation margin decrease or improve data retention characteristic decrease due to removal of some of holes as signal electric charge accumulated in the channel, similarly to the above-described memory cell constituted by one MOS transistor.

As illustrated in FIGS. 3A to 3D, a dynamic flash memory cell 111 is constituted by a MOS transistor without capacitors (refer to Japanese Patent No. 7057032 and K. Sakui, N. Harada, "Dynamic Flash Memory with Dual Gate Surrounding Gate Transistor (SGT)", Proc. IEEE IMW, pp. 72-75 (2021)). As illustrated in FIG. 3A, a floating-body semiconductor base material 102 is positioned on a $SiO_2$ layer 101 of a SOI substrate. An $N^+$ layer 103 connected to a source line SL and an $N^+$ layer 104 connected to a bit line BL are positioned at respective ends of the floating-body semiconductor base material 102. A first gate insulating layer 109a is connected to the $N^+$ layer 103 and covers the floating-body semiconductor base material 102, and a second gate insulating layer 109b is connected to the $N^+$ layer 104 and the first gate insulating layer 109a through a slit insulating film 110 and covers the floating-body semiconductor base material 102. A first gate conductor layer 105a covers the first gate insulating layer 109a and is connected to a plate line PL, and a second gate conductor layer 105b covers the second gate insulating layer 109b and is connected to a word line WL. The slit insulating film 110 is positioned between the first gate conductor layer 105a and the second gate conductor layer 105b. Accordingly, the memory cell 111 as a dynamic flash memory (DFM) is formed. The source line SL may be connected to the N$^+$ layer 104, and the bit line BL may be connected to the N$^+$ layer 103.

As illustrated in FIG. 3A, for example, zero voltage is applied to the N$^+$ layer 103 and positive voltage is applied to the N$^+$ layer 104 so that a first N-channel MOS transistor region provided by the floating-body semiconductor base material 102 covered by the first gate conductor layer 105a is operated as a saturated region, and a second N-channel MOS transistor region provided by the floating-body semiconductor base material 102 covered by the second gate conductor layer 105b is operated as a linear region. As a result, an inversion layer 107b is formed on the entire surface of the second N-channel MOS transistor region without a pinch-off point. The inversion layer 107b formed below the second gate conductor layer 105b connected to the word line WL functions as an effective drain of the first N-channel MOS transistor region. As a result, electric field is maximum in a boundary semiconductor base material between the first N-channel MOS transistor region and the second N-channel MOS transistor region, and an impact ionization phenomenon occurs in this region. As illustrated in FIG. 3B, among electrons and holes generated through the impact ionization phenomenon, the electrons are removed from the floating-body semiconductor base material 102 but some or all of these holes 106 are held in the floating-body semiconductor base material 102. In this manner, memory write operation is performed. This state is allocated as logical storage data "1".

As illustrated in FIG. 3C, for example, positive voltage is applied to the plate line PL, zero voltage is applied to the word line WL and the bit line BL, and negative voltage is applied to the source line SL so that the holes 106 are removed from the floating-body semiconductor base material 102 to perform erase operation. This state is allocated as logical storage data "0". At data reading, voltage applied to the first gate conductor layer 105a connected to the plate line PL is set to be higher than threshold voltage for logical storage data "1" and lower than threshold voltage for logical storage data "0". Accordingly, such a characteristic is obtained that no current flows when voltage of the word line WL is set to be high at reading of logical storage data "0" as illustrated in FIG. 3D. With this characteristic, the operation margin is significantly expanded as compared to a DRAM memory cell including no capacitor and formed with one MOS transistor. In this memory cell, since channels in the first and second N-channel MOS transistor regions with gates that are the first gate conductor layer 105a connected to the plate line PL and the second gate conductor layer 105b connected to the word line WL are connected to each other through the floating-body semiconductor base material 102, voltage variation of the floating-body semiconductor base material 102 when select pulsed voltage is applied to the word line WL is largely suppressed. Accordingly, the problems of the above-described memory cell, such as operation margin decrease or data retention characteristic decrease due to removal of some of holes as signal electric charge accumulated in a channel, are largely improved. Further characteristic improvement will be required for such a memory element in the future.

In a dynamic flash memory cell, refresh operation for logic data retention of a memory cell is required.

SUMMARY OF THE INVENTION

To solve the above-described problem, a first invention is a memory device formed with at least one memory array, the memory array being formed with a plurality of pages and a plurality of bit lines, each page being formed with a plurality of memory cells arranged in a row direction on a substrate in a plan view, the plurality of memory cells being connected to the bit lines disposed in a column direction.

Each of the memory cells included in each of the pages includes:

a semiconductor base material positioned on the substrate and either standing in a vertical direction or extending in a horizontal direction;

a first impurity region and a second impurity region positioned in respective ends of the semiconductor base material;

a gate insulating layer being in contact with a side surface of the semiconductor base material between the first impurity region and the second impurity region;

a first gate conductor layer at least partially covering the gate insulating layer; and a second gate conductor layer positioned adjacent to the first gate conductor layer and being in contact with the side surface of the gate insulating layer.

In the memory cell, the first impurity region is connected to a source line, the second impurity region is connected to a corresponding one of the bit lines, one of the first and second gate conductor layers is connected to a word line, and the other is connected to a plate line.

A page erase operation, a page write operation, and a page read operation are performed by controlling a voltage applied to each of the source line, the bit line, the word line, and the plate line.

The bit line is connected to a sense amplifier circuit through a switch circuit.

At least one of the bit lines and one of the pages are selected in the page erase operation, the page write operation, and the page read operation, and an erase operation on the memory cell connected to both the bit line and the page thus selected, a write operation of storage data of the sense amplifier circuit to the memory cell, or a read operation from the memory cell to the sense amplifier circuit is executed.

According to a second invention, in the above-described first invention, the voltage of the bit line when not selected is set to zero volt or a floating state in the page erase operation, the page write operation, and the page read operation.

According to a third invention, in the above-described first invention, the voltage applied to each of the source line, the bit line, the word line, and the plate line is controlled to execute, in the page erase operation, an operation that decreases the number of holes remaining in the semiconductor base material by annihilating some holes in the semiconductor base material of the memory cell of the page, and the voltage applied to each of the source line, the bit line, the word line, and the plate line is controlled to execute, in the page write operation, an operation that increases the number of holes remaining in the semiconductor base material of the selected memory cell of the page through impact ionization phenomenon.

According to a fourth invention, in the above-described first invention, the word line and the plate line are disposed in parallel to each other in a plan view, and the bit line is disposed in the vertical direction with respect to the word line and the plate line in a plan view.

According to a fifth invention, in the above-described first invention, a first gate capacitance between the first or second gate conductor layer connected to the plate line and the semiconductor base material is larger than a second gate capacitance between the first or second gate conductor layer connected to the word line and the semiconductor base material.

According to a sixth invention, in the above-described first invention, in a plan view, the source line is separated for each of the memory cells arrayed in the column direction and is disposed in parallel to the first word line, the plate line.

According to a seventh invention, in the above-described first invention, the source line is connected in common to all of the memory cells of the pages adjacent to each other in a plan view.

According to an eighth invention, in the above-described first invention, the semiconductor base material is a P-type semiconductor layer, and the first impurity region and the second impurity region are N-type semiconductor layers.

According to a ninth invention, in the above-described first invention, all of the memory cells connected to at least two pairs of the pages are erased in the page erase operation.

According to a tenth invention, in the above-described first invention, the word line and the plate line are connected to a row decoder circuit, a row address is input to the row decoder circuit, and the page is selected in accordance with the row address.

According to an eleventh invention, in the above-described first invention, the first or second gate conductor layer connected to the plate line is divided in a channel direction into a plurality of parts.

In the above-described first invention, one or both of the first and second gate conductor layers are divided into two or more separated gate conductor layers in a plan view or in the vertical direction, and the separated gate conductor layers are operated in or out of synchronization (twelfth invention).

In the above-described twelfth invention, the separated gate conductor layers of one of the first and second gate conductor layers are disposed on both sides of the other gate conductor layer in the vertical direction (thirteenth invention).

BRIEF DESCRIPTION OF THE DRAWINGS

FIG. 2D is a diagram for description of the mechanism of an erase operation on a memory cell connected to at least one bit line in the memory device according to the first embodiment, a write operation of storage data of a sense amplifier circuit to the memory cell, or a read operation from the memory cell to the sense amplifier circuit;

FIG. 2I is a diagram for description of the mechanism of an erase operation on a memory cell connected to at least one bit line in the memory device according to the first embodiment, a write operation of storage data of a sense amplifier circuit to the memory cell, or a read operation from the memory cell to the sense amplifier circuit;

DETAILED DESCRIPTION OF THE PREFERRED EMBODIMENTS

A memory device (hereinafter referred to as dynamic flash memory) including a semiconductor element according to each embodiment of the present invention will be described below with reference to the accompanying drawings.

First Embodiment

The structure and operation mechanism of a dynamic flash memory cell according to a first embodiment of the present invention will be described below with reference to FIGS. 1 and 2A to 2J. The structure of the dynamic flash memory cell will be described with reference to FIG. 1. Then, a page read operation mechanism with which a refresh operation of logical "1" data and logical "O" data is possible will be described with reference to FIGS. 2A to 2J.

Figure 1:
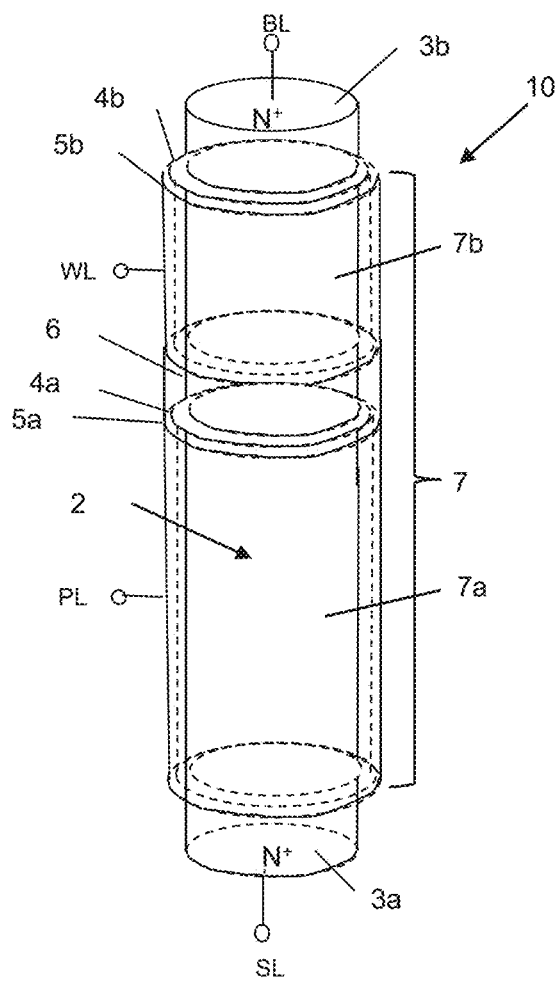
FIG. 1 is a structural diagram of a memory cell including an SGT according to a first embodiment.

FIG. 1 illustrates the structure of the dynamic flash memory cell according to the first embodiment of the present invention. N⁺ layers 3a and 3b (examples of "first impurity region" and "second impurity region" in the claims) one of which serves as a source and the other of which serves as a drain are formed at upper and lower positions in a silicon semiconductor pillar 2 (hereinafter, a silicon semiconductor pillar is referred to as an "Si pillar") (example of "semiconductor base material" in the claims) having the conduction type of P-type or i-type (intrinsic type) and formed on a substrate. Part of the Si pillar 2 between the N⁺ layers 3a and 3b as the source and the drain is a semiconductor base material 7 (example of "semiconductor base material" in the claims). A first gate insulating layer 4a (example of "first gate insulating layer" in the claims) and a second gate insulating layer 4b (example of "second gate insulating layer" in the claims) are formed around the semiconductor base material 7. The first gate insulating layer 4a and the second gate insulating layer 4b are in contact with or in proximity to the N⁺ layers 3a and 3b, respectively, as the source and the drain. A first gate conductor layer 5a (example of "first gate conductor layer" in the claims) and a second gate conductor layer 5b (example of "second gate conductor layer" in the claims) are formed around the first gate insulating layer 4a and the second gate insulating layer 4b, respectively. The first gate conductor layer 5a and the second gate conductor layer 5b are separated from each other by an insulating layer 6. The semiconductor base material 7 between the N⁺ layers 3a and 3b is formed with a first semiconductor base material 7a surrounded by the first gate insulating layer 4a and with a second semiconductor base material 7b surrounded by the second gate insulating layer 4b. Accordingly, a dynamic flash memory cell 10 is formed with the N⁺ layers 3a and 3b as the source and the drain, the semiconductor base material 7, the first gate insulating layer 4a, the second gate insulating layer 4b, the first gate conductor layer 5a, and the second gate conductor layer 5b. The N⁺ layer 3a as the source is connected to a source line SL (example of "source line" in the claims), the N⁺ layer 3b as the drain is connected to a bit line BL (example of "bit line" in the claims), the first gate conductor layer 5a is connected to a plate line PL (example of "plate line" in the claims), and the second gate conductor layer 5b is connected to a word line WL (example of "word line" in the claims). It is desirable to have a structure with which a first gate capacitance $C_{PL}$ (example of "first gate capacitance" in the claims) of the first gate conductor layer 5a connected to the plate line PL is larger than a second gate capacitance $C_{WL}$ (example of "second gate capacitance" in the claims) of the second gate conductor layer 5b connected to the word line WL. As another structure, the first gate conductor layer 5a may be adjacent to the N⁺ layer 3b connected to the bit line BL and the second gate conductor layer 5b may be adjacent to the N⁺ layer 3a connected to the source line SL.

The mechanism of an erase operation on a memory cell connected to at least one bit line in the dynamic flash memory cell according to the first embodiment of the present invention, a write operation of storage data of a sense amplifier circuit (example of "sense amplifier circuit" in the claims) to the memory cell, or a read operation from the memory cell to the sense amplifier circuit will be described below with reference to FIGS. 2A to 2J.

Figure 2A:
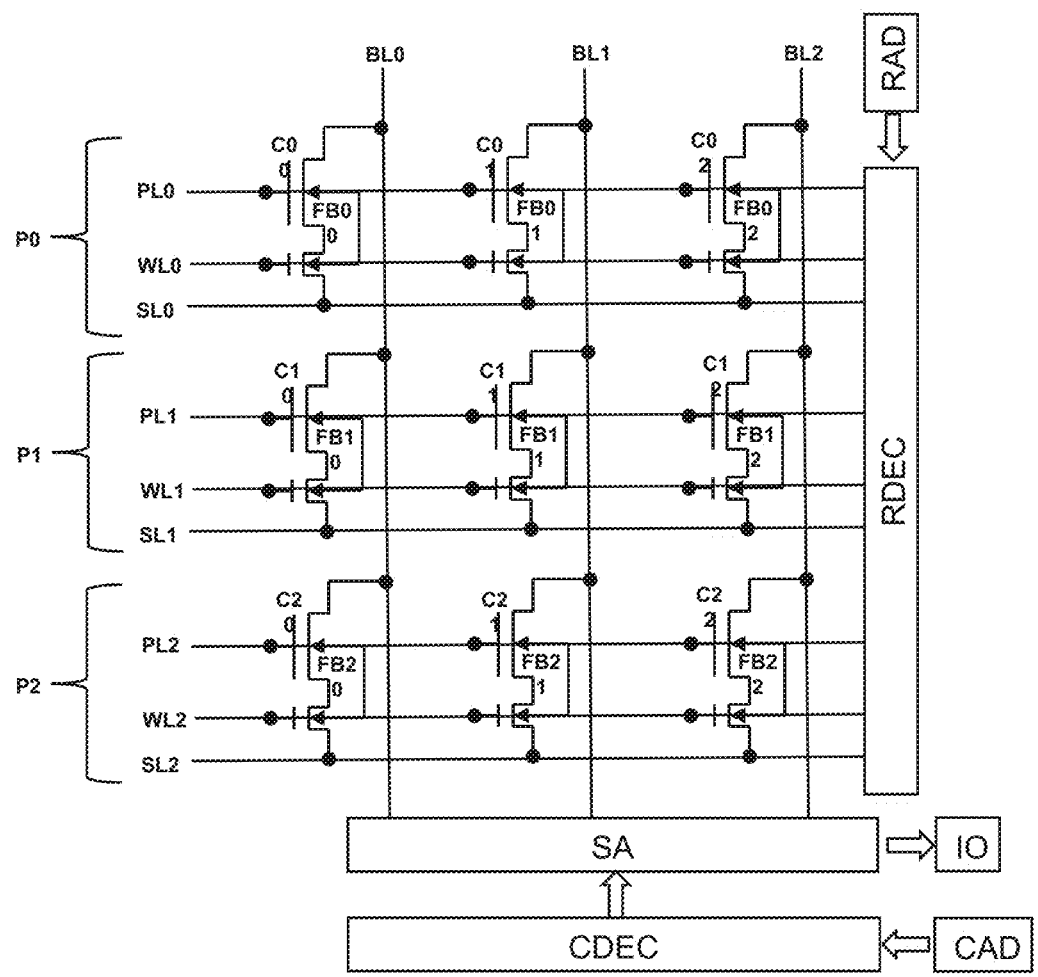
FIG. 2A is a diagram for description of the mechanism of an erase operation on a memory cell connected to at least one bit line in a memory device according to the first embodiment, a write operation of storage data of a sense amplifier circuit to the memory cell, or a read operation from the memory cell to the sense amplifier circuit.

FIG. 2A illustrates a memory cell array block diagram including a main circuit. Word lines WL0 to WL2 and plate lines PL0 to PL2 are connected to a row decoder circuit RDEC (example of "row decoder circuit" in the claims). A row address RAD (example of "row address" in the claims) is input to the row decoder circuit RDEC, and pages P0 to P2 are selected in accordance with the row address RAD. Bit lines BL0 to BL2 are connected to a sense amplifier circuit SA. The sense amplifier circuit SA is connected to a column decoder circuit CDEC, a column address CAD is input to the column decoder circuit CDEC, and the sense amplifier circuit SA is selectively connected to an input-output circuit IO in accordance with the column address CAD.

In the memory array in FIG. 2A, the plate lines PL0 to PL2 are provided on a side closer to the bit lines BL0 to BL2, and the word lines WL0 to WL2 are provided on a side closer to source lines SL0 to SL2. This configuration corresponds to the case in FIG. 1 where the first gate conductor layer 5a is connected to the word line WL and the second gate conductor layer 5b is connected to the plate line PL. In this example, a total of nine memory cells C00 to C22 on three rows and three columns are illustrated in a plan view, but the number of memory cells in an actual bank is larger than nine. In a case where the memory cells are arranged in a matrix, one of directions of the arrangement is referred to as a "row direction" (or "row"), and a direction orthogonal to the row direction is referred to as a "column direction" (or "column"). In a plan view, the source lines SL0 to SL2, the plate lines PL0 to PL2, and the word lines WL0 to WL2 are disposed in parallel to one another, and the bit lines BL0 to BL2 are disposed in a direction orthogonal to the parallel lines. For example, in the memory array, selection of an optional page (example of "page" in the claims) P1 is selection of the memory cells C10 to C12 connected to the plate line PL1, the word line WL1, and the source line SL1.

Figure 2B:
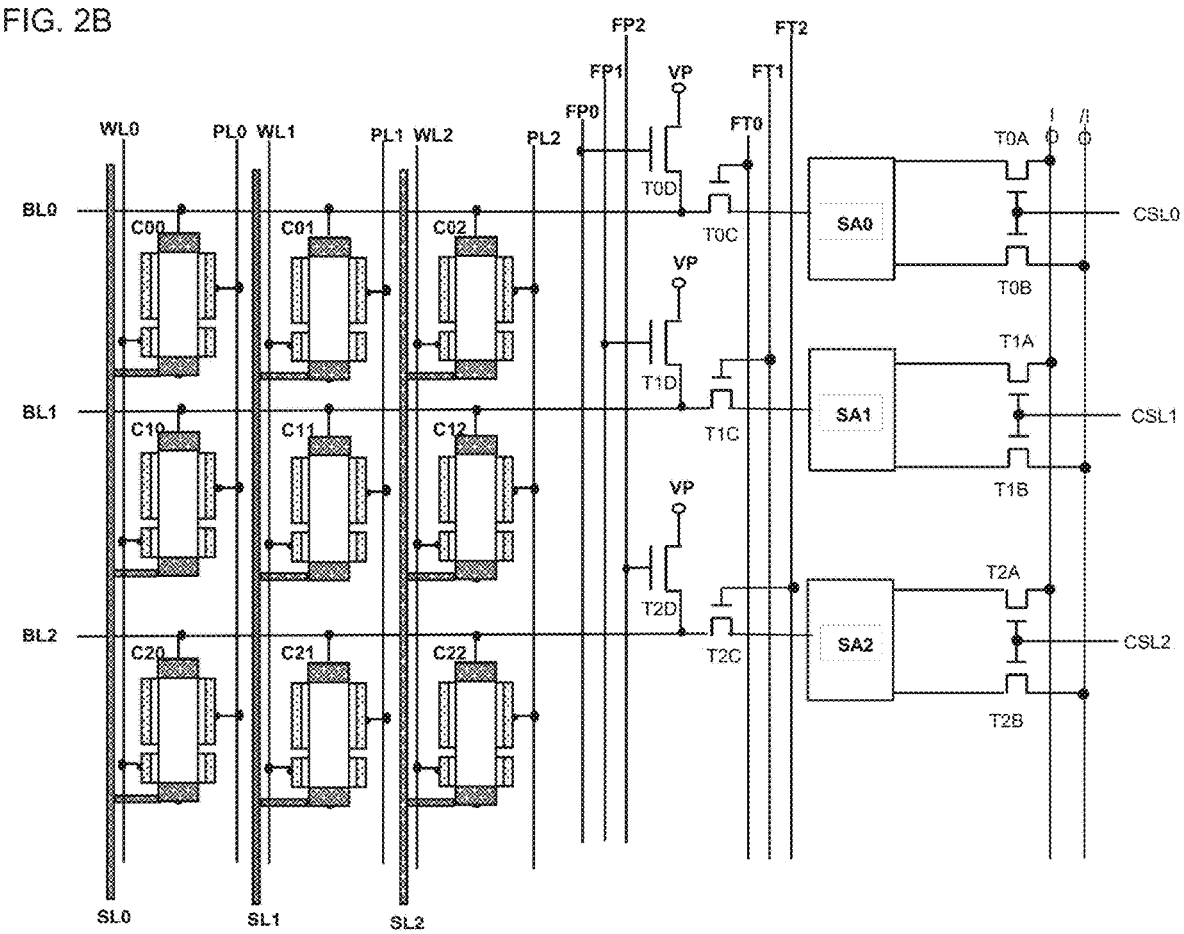
FIG. 2B is a diagram for description of the mechanism of an erase operation on a memory cell connected to at least one bit line in the memory device according to the first embodiment, a write operation of storage data of a sense amplifier circuit to the memory cell, or a read operation from the memory cell to the sense amplifier circuit.

FIG. 2B more specifically illustrates an equivalent circuit of the memory cell block in FIG. 2A. Each of transistors T0C to T2C to the gates of which transfer signals FT0 to FT2 are input forms a switch circuit (example of "switch circuit" in the claims). A bit line supply voltage VP is applied to the drains of transistors T0D to T2D to the gates of which bit line supply signals FP0 to FP2 are applied. The sources thereof are connected to the respective bit lines BL0 to BL2. The bit lines BL0 to BL2 are connected to sense amplifier circuits SA0 to SA2, respectively, through switch circuits. The sense amplifier circuits SA0 to SA2 are connected to a pair of complementary input-output lines IO and /IO through transistors T0A to T2B the gates of which are connected to column select lines CSL0 to CSL2.

Figure 2C:
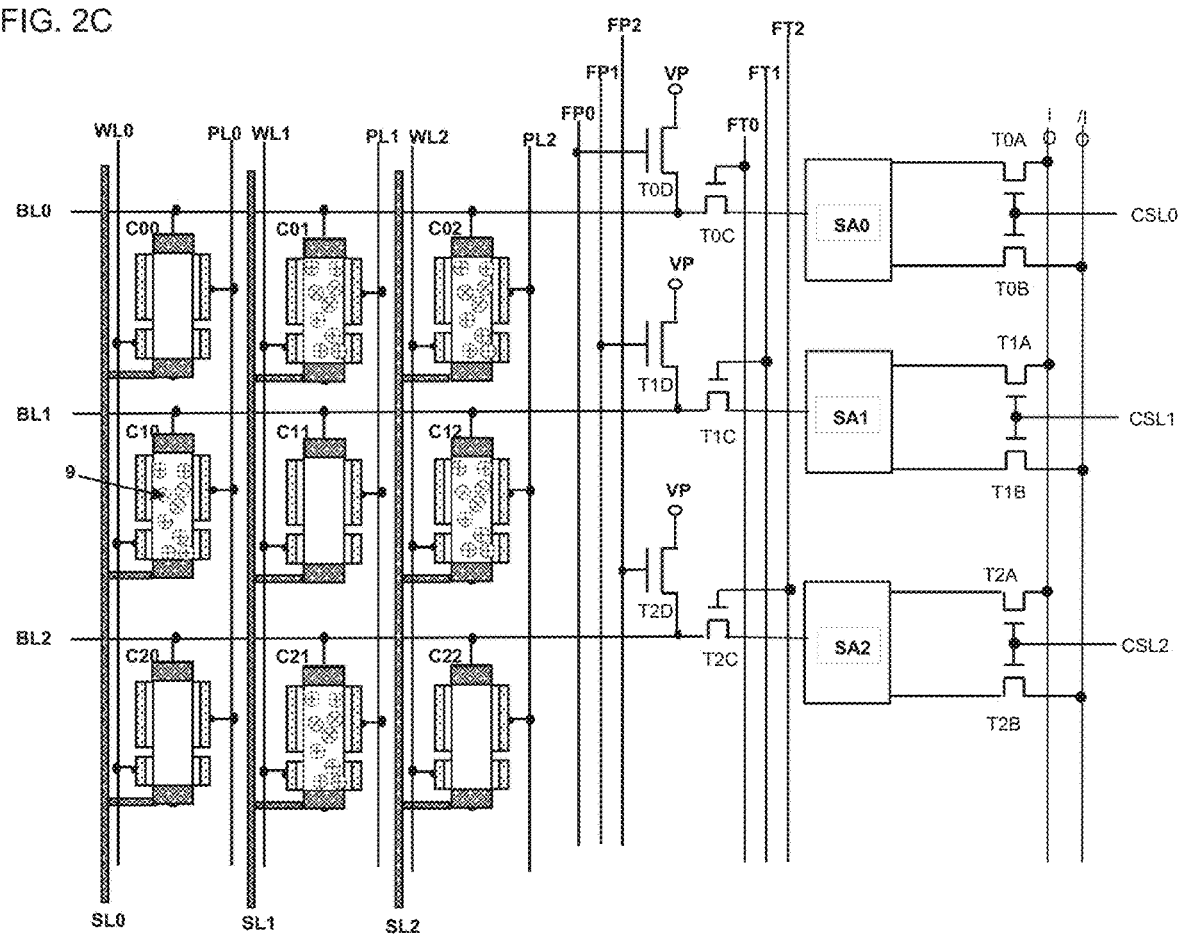
FIG. 2C is a diagram for description of the mechanism of an erase operation on a memory cell connected to at least one bit line in the memory device according to the first embodiment, a write operation of storage data of a sense amplifier circuit to the memory cell, or a read operation from the memory cell to the sense amplifier circuit.

FIG. 2C illustrates a case where logical "1" data is randomly written to the memory cells C01, C02, C10, C12, and C21 among the memory cells C00 to C22 at an optional timing. In this case, holes 9 are accumulated in the semiconductor base material 7 illustrated in FIG. 1 in the memory cells C01, C02, C10, C12, and C21. However, no holes 9 are accumulated in the semiconductor base material 7 illustrated in FIG. 1 in the memory cells C00, C11, C20, and C22 to which logical "1" data is not written.

A page read operation (example of "page read operation" in the claims) will be described below with reference to an operation waveform diagram in FIG. 2D. At a first time point T1, the bit line supply signal FP0 is selected and increased from a ground voltage Vss to a first voltage V1. The first voltage V1 is, for example, 2.0 V, and the bit line supply voltage VP is, for example, 0.6 V. Accordingly, the N-type MOS transistor T0D operates in a linear region. As a result, the bit line BL0 is charged from a ground voltage/floating voltage Vss/FL to a second voltage V2 at a second time point T2.

Figure 2E:
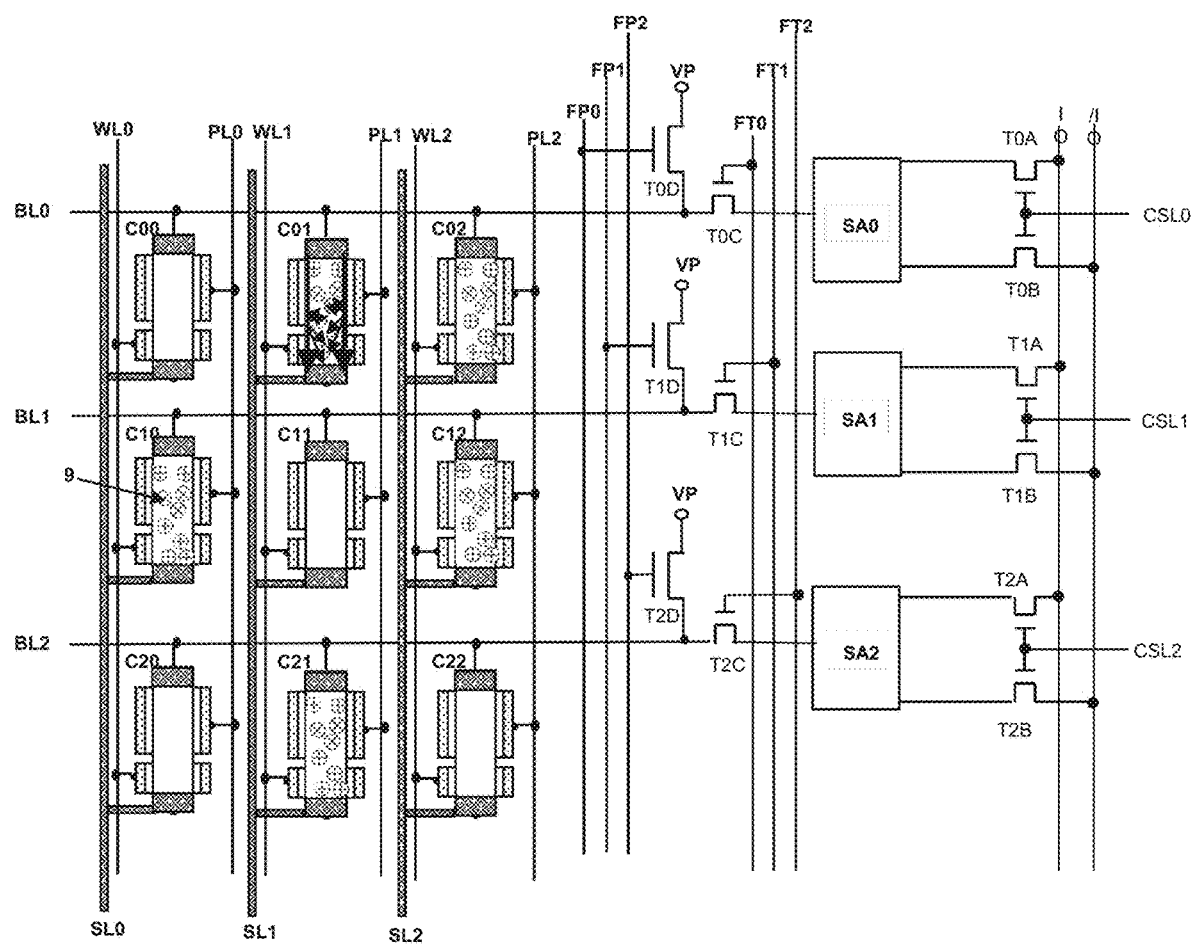
FIG. 2E is a diagram for description of the mechanism of an erase operation on a memory cell connected to at least one bit line in the memory device according to the first embodiment, a write operation of storage data of a sense amplifier circuit to the memory cell, or a read operation from the memory cell to the sense amplifier circuit.
Figure 2F:
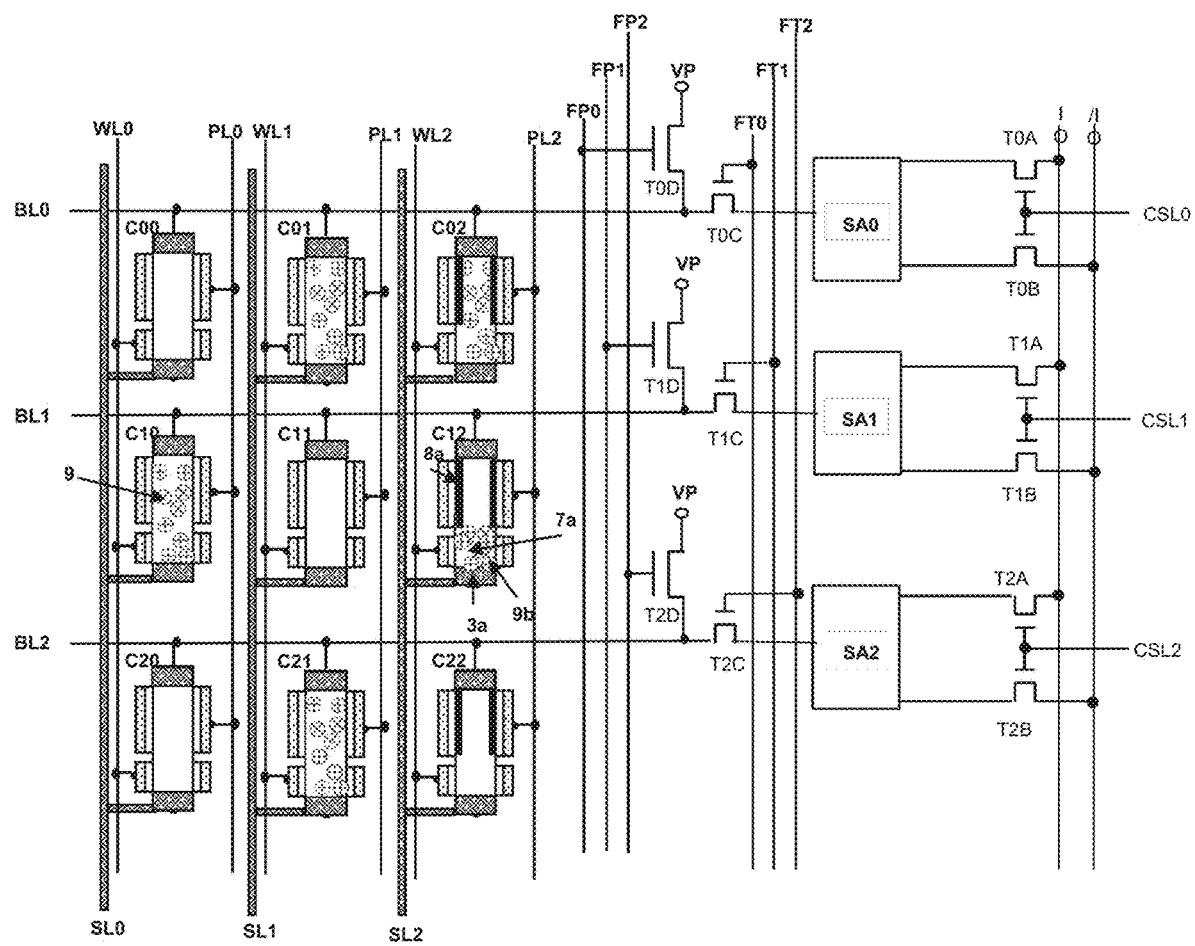
FIG. 2F is a diagram for description of the mechanism of an erase operation on a memory cell connected to at least one bit line in the memory device according to the first embodiment, a write operation of storage data of a sense amplifier circuit to the memory cell, or a read operation from the memory cell to the sense amplifier circuit.
Figure 2G:
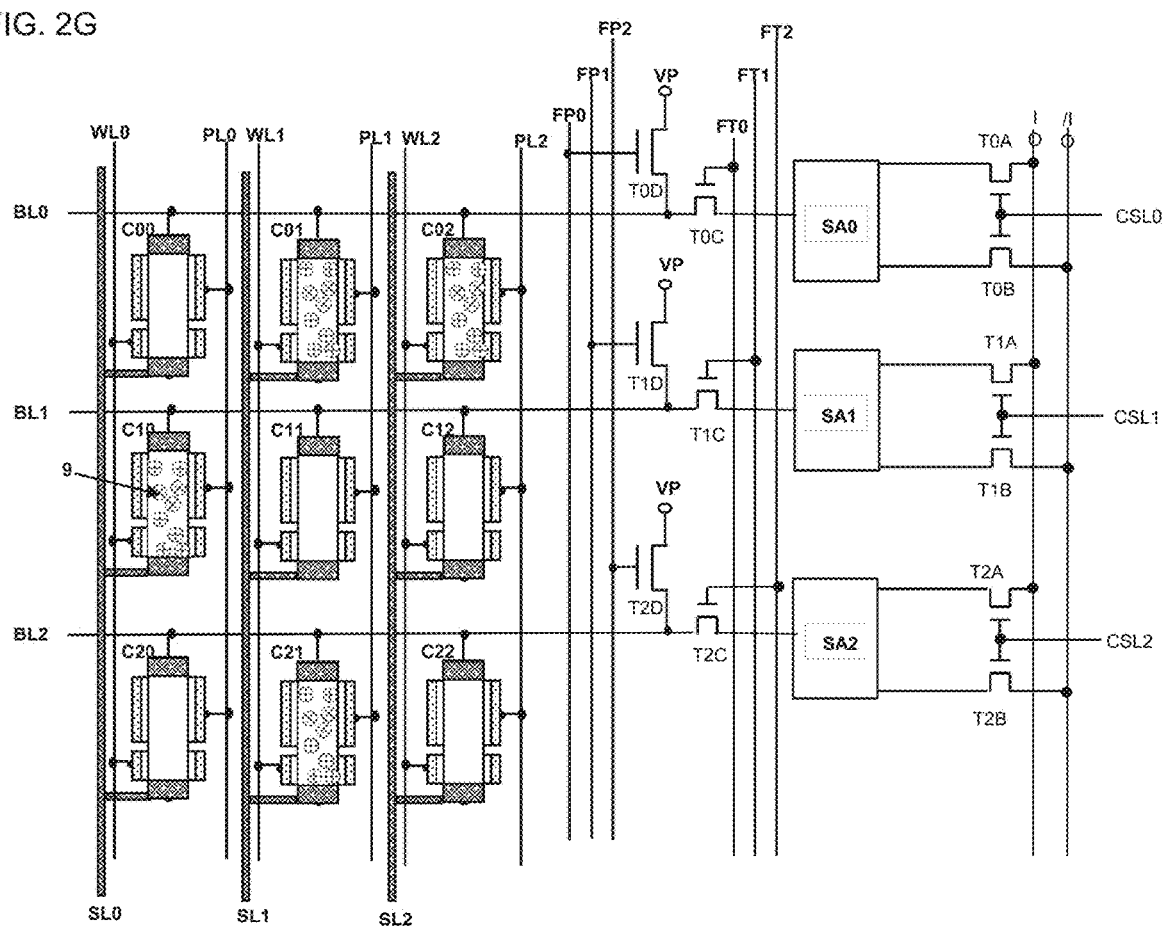
FIG. 2G is a diagram for description of the mechanism of an erase operation on a memory cell connected to at least one bit line in the memory device according to the first embodiment, a write operation of storage data of a sense amplifier circuit to the memory cell, or a read operation from the memory cell to the sense amplifier circuit.

At a third time point T3, the first page P1 is selected, and the word line WL1 and the plate line PL1 belonging to the page P1 are increased from the ground voltage Vss to a third voltage V3 and a fourth voltage V4, respectively. The third voltage V3 and the fourth voltage V4 are, for example, 1.2 V and 0.9 V, respectively. Before the third time point T3, the bit line supply signal FP0 is decreased from the first voltage V1 to the ground voltage Vss. As illustrated in FIG. 2E, the threshold voltage of an N-channel MOS transistor region where the semiconductor base material 7 is surrounded by the plate line PL1 of the memory cell C01 storing logical "1" data is equal to or lower than 0.9 V, for example, and memory cell current flows in the memory cell C01. As a result, the bit line BL0 is electrically discharged from the second voltage V2 to Vss. Meanwhile, in the memory cell C01, holes 9 are formed inside the semiconductor base material 7 illustrated in FIG. 1 through an impact ionization phenomenon, and accordingly, a refresh operation for logical "1" data is performed. Thus, in a case where the number of holes 9 accumulated in the semiconductor base material 7 has decreased because of being left unused for a long time, it is possible to increase the number of holes to a number necessary for logical "1" data, which improves data retention characteristics of logical "1" data.

At a fourth time point T4, the transfer signal FT0 is increased from the ground voltage Vss to a fifth voltage V5. As a result, the bit line BL0 and the sense amplifier circuit SA0 are electrically connected to each other. Read page data from the memory cell C01 is forwarded to the sense amplifier circuit SA0. At a fifth time point T5, upon input from the column select line CSL0 to the gates of the transistors T0A and T0B, for example, page data stored in the sense amplifier circuit SA0 is output to the complementary input-output lines IO and /IO. At a sixth time point T6, the transfer signal FT0 is decreased from the fifth voltage V5 to the ground voltage Vss.

In this manner, at least one bit line BL0 included in the memory array is connected to the sense amplifier circuit SA0 to selectively read data from a memory cell. Since the number of memory cells subjected to data reading is reduced, significant reduction of power consumption and increase in operation speed are achieved. A plurality of bit lines may be simultaneously subjected to reading. For example, power consumption is reduced to a quarter approximately in a case where a quarter of bit lines included in the memory array are simultaneously subjected to reading.

A page erase operation (example of "page erase operation" in the claims) will be described below with reference to the operation waveform diagram in FIG. 2D. At a seventh time point T7, the bit line supply signal FP1 is increased from the ground voltage Vss to a sixth voltage V6, and charging of the bit line BL2 is started. Then, at an eighth time point T8, the bit line BL1 is charged from the ground voltage Vss to a seventh voltage V7. The sixth voltage V6 is, for example, 2.0 V, and the bit line supply voltage VP is, for example, 0.6 V. Accordingly, the N-type MOS transistor T1D operates in a linear region. As a result, the bit line BL1 is charged from the ground/floating voltage Vss/FL to 0.6 V.

At a ninth time point T9 in FIG. 2D, the second page P2 in FIG. 2C is selected, and the plate line PL2 belonging to the page P2 is increased from the ground voltage Vss to an eighth voltage V8. The word line WL2 is maintained at Vss. Accordingly, for the memory cell C12, the seventh voltage V7 (for example, 0.6 V) is applied to the bit line BL1, the ground voltage Vss (for example, 0 V) is applied to the source line SL2, the eighth voltage V8 (for example, 2 V) is applied to the plate line PL2, and the ground voltage (for example, 0 V) is applied to the word line WL1. As a result, as illustrated in 2F, holes 9b (illustrated in FIG. 2F) having positive electric charge are collected from a side closer to the plate line PL2 to which 2 V is applied to a side closer to the word line WL2 to which 0 V is applied. Accordingly, the voltage of the semiconductor base material 7a (illustrated in FIG. 2F) surrounded by the word line WL2 increases. Moreover, an inversion layer 8a (illustrated in FIG. 2F) is formed in the semiconductor base material 7 of the memory cell C12, which is surrounded by the plate line PL2. Accordingly, the PN junction between the $N^+$ layer 3a (illustrated in FIG. 2F) of the source line SL2 and the semiconductor base material 7 as a Player is forward-biased, and the holes 9b are discharged to the $N^+$ layer 3a of the source line SL2. The concentration of the holes 9b collected in the semiconductor base material 7 as a Player on the word line WL2 side is sufficiently higher than the concentration of holes facing the $N^+$ layer 3a, and accordingly, the holes 9b diffuse with the concentration gradient and flow into the $N^+$ layer 3a. Moreover, the electron concentration of the $N^+$ layer 3a is higher than the electron concentration of the semiconductor base material 7 as a Player, and accordingly, electrons flow into the semiconductor base material 7 as a Player through diffusion with the concentration gradient. The electrons having flowed into the semiconductor base material 7 as a Player are recombined with holes in the semiconductor base material 7 as a Player and annihilated. However, not all injected electrons are annihilated, and electrons not annihilated drift and flow into the $N^+$ layer 3b of the bit line BL1. Since electrons are sequentially supplied from the source line SL2, excessive holes are recombined with electrons for an extremely short time, and accordingly, a page erase operation is performed. Consumed electric power is due to electrons flowing in from the source line SL2 and extremely smaller than power consumption in a page write operation. As a result, the threshold voltage of the N-channel MOS transistor region where the semiconductor base material 7 is surrounded by the word line WL2 and the plate line PL2 of the memory cell C12 becomes high.

In FIG. 2C, holes 9 exist in the semiconductor base material as a Player in the memory cell C12. In a state illustrated in FIG. 2G, however, the number of holes 9 in the semiconductor base material as a Player in the memory cell C12 decreases, storage data in the memory cell C12 is rewritten from logical "1" data to logical "0" data, and accordingly, a page erase operation is performed. At a tenth time point T10, the voltage of the plate line PL2 is decreased from the eighth voltage V8 to the ground voltage Vss and the voltage of the bit line BL1 is decreased from the seventh voltage V7 to the ground voltage Vss, which ends the page erase operation.

In this manner, a page erase operation of the memory cell C12 connected to at least one bit line BL1 included in the memory array can be performed. As a result, significant reduction of power consumption and increase in operation speed of a page erase operation are achieved. A plurality of bit lines may be simultaneously subjected to a page erase operation. For example, power consumption is reduced to a quarter approximately in a case where a quarter of bit lines included in the memory array are simultaneously subjected to a page erase operation.

Figure 2H:
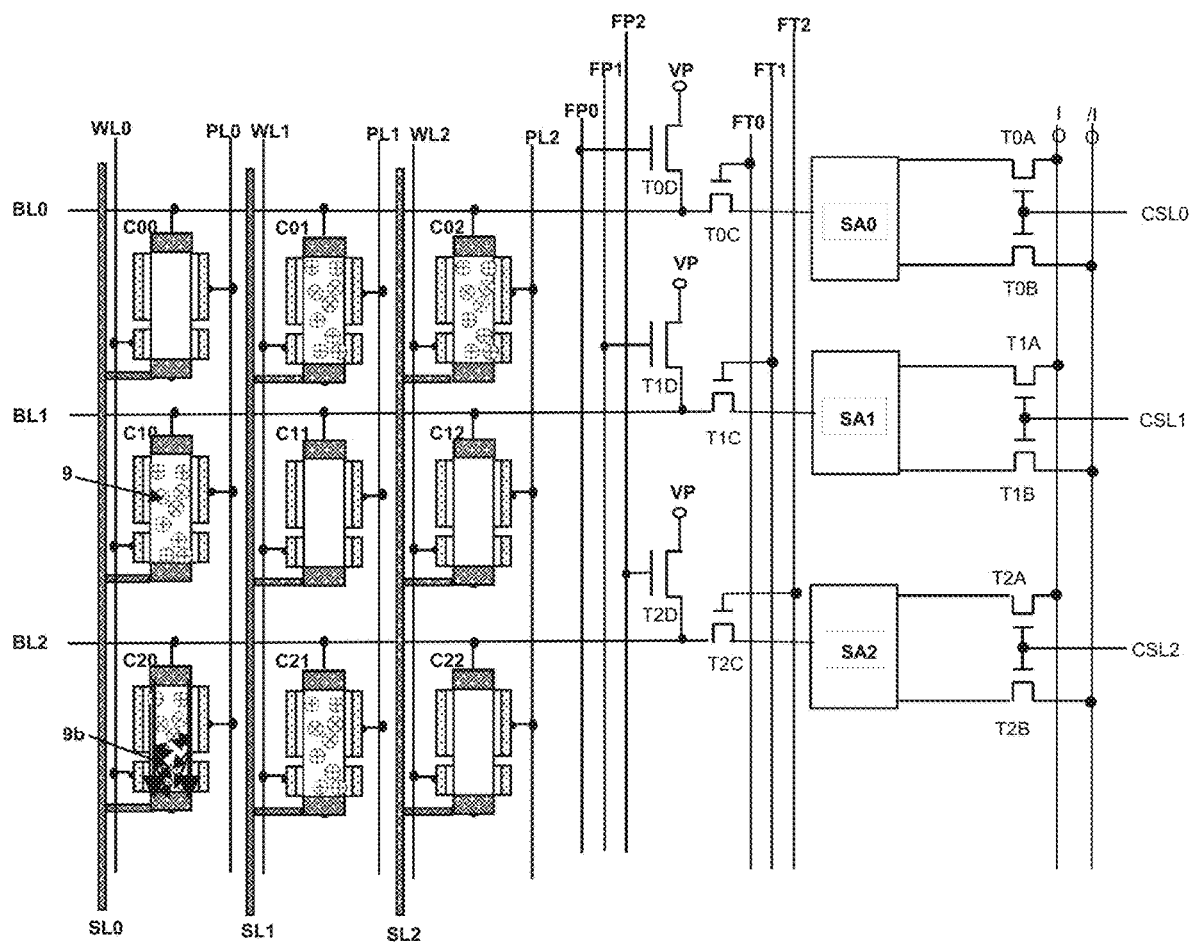
FIG. 2H is a diagram for description of the mechanism of an erase operation on a memory cell connected to at least one bit line in the memory device according to the first embodiment, a write operation of storage data of a sense amplifier circuit to the memory cell, or a read operation from the memory cell to the sense amplifier circuit.
Figure 21:
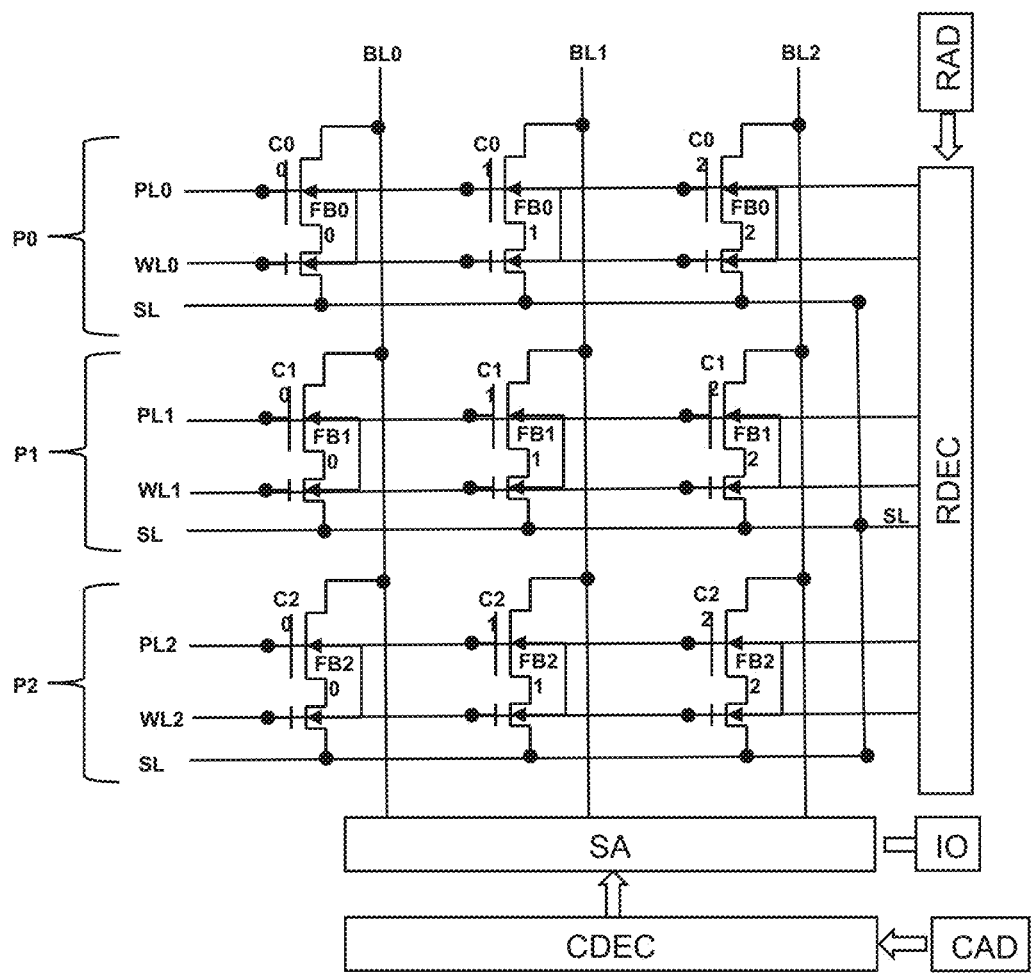

A page write operation (example of "page write operation" in the claims) will be described below. In the operation waveform in FIG. 2D, at an eleventh time point T11, the voltage of the transfer signal FT2 is increased from the ground voltage Vss to a ninth voltage V9, and the bit line BL2 and the sense amplifier circuit SA2 are connected to each other. Page write data is stored (uploaded) in the sense amplifier circuit SA2 in advance. In this example, it is assumed that logical "1" data is stored as write data. As a result, at a twelfth time point T12, the voltage of the bit line BL2 is increased from the ground voltage Vss to a tenth voltage V10 for logical "1" data writing. The tenth voltage V10 is, for example, 1.0 V. At a thirteenth time point T13, the word line WL0 and the plate line PL0 belonging to the page P0 are increased from the ground voltage Vss to an eleventh voltage V11 and a twelfth voltage V12, respectively. The eleventh voltage V11 and the twelfth voltage V12 are, for example, 1.5 V and 1.2 V, respectively. As a result, the memory cell C20 is selected as illustrated in FIG. 2H, an impact ionization phenomenon occurs in the semiconductor base material 7, the holes 9b (illustrated in FIG. 2H) are accumulated, and storage data in the memory cell C20 is rewritten from logical "0" data to logical "1" data. At a fourteenth time point T14, the voltages of the bit line BL2, the word line WL0, and the plate line PL0 are decreased from the tenth voltage V10, the eleventh voltage V11, and the twelfth voltage V12, respectively, to the ground voltage Vss, which ends the page write operation.

In this manner, page writing of the memory cell C20 connected to at least one bit line BL2 included in the memory array can be performed. As a result, significant reduction of power consumption and increase in operation speed of a page write operation are achieved. A plurality of bit lines may be simultaneously subjected to a page write operation. For example, power consumption is reduced to a quarter approximately in a case where a quarter of bit lines included in the memory array are simultaneously subjected to a page erase operation.

As illustrated in FIG. 2I, the source line SL may be connected in common to all memory cells of the pages adjacent to each other. As a result, the freedom of designing and process increases.

Figure 2J:
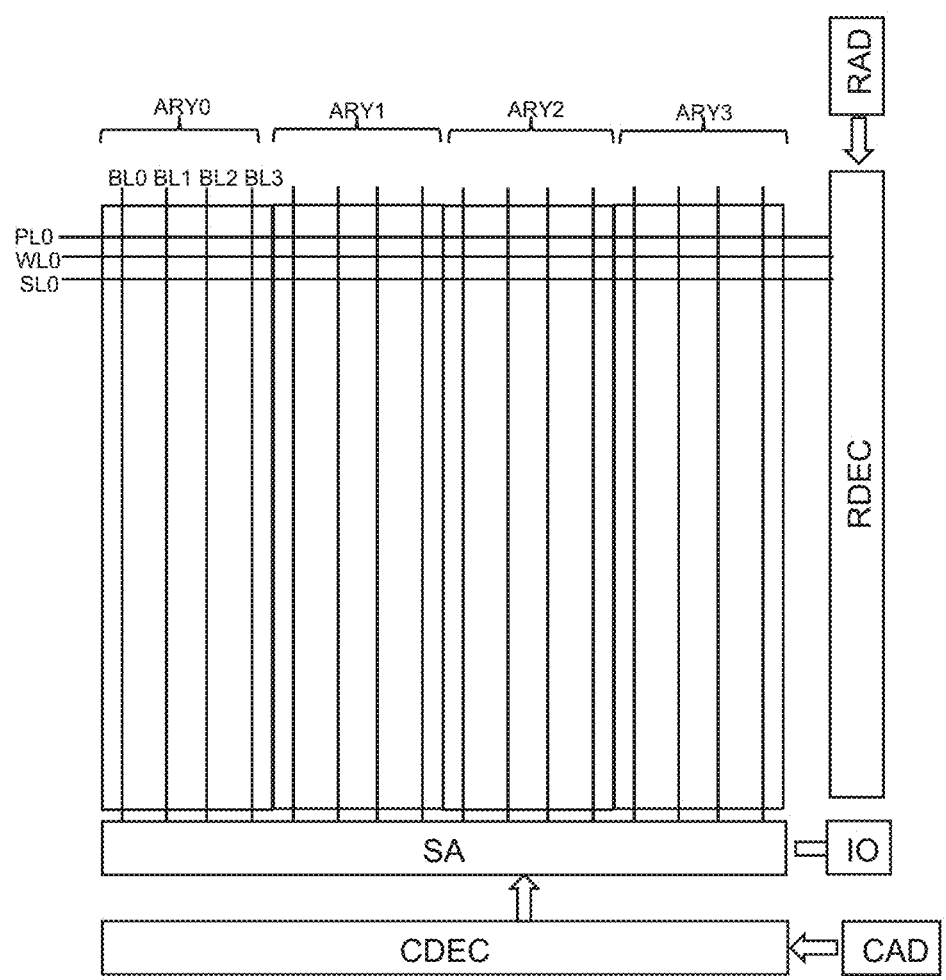
FIG. 2J is a diagram for description of the mechanism of an erase operation on a memory cell connected to at least one bit line in the memory device according to the first embodiment, a write operation of storage data of a sense amplifier circuit to the memory cell, or a read operation from the memory cell to the sense amplifier circuit.
Figure 3A:
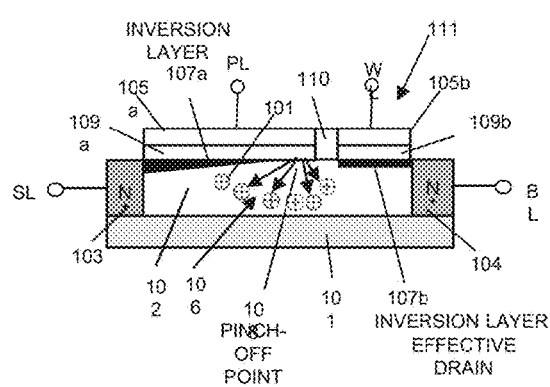
FIGS. 3A, 3B, 3C and 3D are diagrams for description of a dynamic flash memory of a conventional example.
Figure 3B:
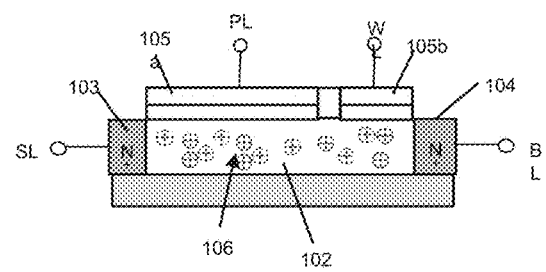
Figure 3C:
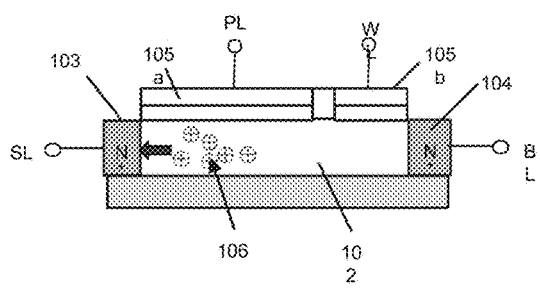
Figure 3D:
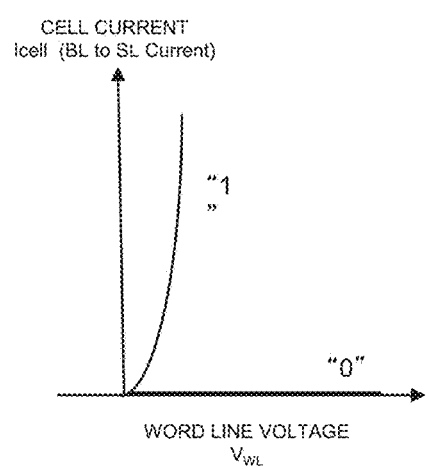

FIG. 2J illustrates an example in which the memory array is equally divided into four to obtain four sub arrays ARY0 to ARY3. For example, four bit lines BL0 to BL3 belong to each of the sub arrays ARY0 to ARY3. In reality, the number of bit lines belonging to each of the sub arrays ARY0 to ARY3 may be larger than four. A page read operation, a page erase operation, and a page write operation can be performed by controlling a bit line voltage for each sub array. As a result, significant reduction of power consumption and increase in operation speed of a page write operation are achieved. In this example, a quarter of bit lines included in the memory array are simultaneously subjected to a page read operation, a page erase operation, or a page write operation, and accordingly, power consumption is reduced to a quarter approximately.

As illustrated in FIG. 2D, such a continuous memory operation is possible that a page read operation READ is performed from the first time point T1 to the fifth time point T5, a page erase operation ERASE is performed from the sixth time point T6 to the tenth time point T10, and a page write operation WRITE is performed from the eleventh time point T11 to the fourteenth time point T14. In this case as well, reduction of power consumption and increase in operation speed can be achieved by performing partial activation in each operation mode.

The dynamic flash memory operation described above in the present embodiment can be performed even when the horizontal sectional shape of the Si pillar 2 in FIG. 1 is circular, elliptical, or rectangular. Circular, elliptical, and rectangular dynamic flash memory cells may be provided in mixture on the same chip.

With reference to FIG. 1, a dynamic flash memory element is described above with an example of an SGT including the first gate insulating layer 4a and the second gate insulating layer 4b, which entirely surround the side surface of the Si pillar 2 vertically standing on the substrate, and the first gate conductor layer 5a and the second gate conductor layer 5b, which entirely surround the first gate insulating layer 4a and the second gate insulating layer 4b. As described above in the present embodiment, the dynamic flash memory element only needs to have a structure satisfying a condition that the holes 9 generated through an impact ionization phenomenon are retained in the semiconductor base material 7. For this purpose, the semiconductor base material 7 only needs to have a floating body structure electrically separated from the substrate 1. Accordingly, even when the semiconductor base material is horizontally formed with respect to the substrate 1 (such that the central axis of the semiconductor base material is parallel to the substrate), the above-described dynamic flash memory operation can be performed by using, for example, a gate-all-around (GAA: refer to J. Y. Song, W. Y. Choi, J. H. Park, J. D. Lee, and B-G. Park: "Design Optimization of Gate-All-Around (GAA) MOSFETs", IEEE Trans. Electron Devices, vol. 5, no. 3, pp. 186-191, (2006), for example) technology or a nanosheet technology (refer to N. Loubet, et al.: "Stacked Nanosheet Gate-All-Around Transistor to Enable Scaling Beyond FinFET", 2017 IEEE Symposium on VLSI Technology Digest of Technical Papers, T17-5, T230-T231, (2017), for example) as an SGT. Moreover, another structure in which a plurality of GAAs or Nanosheets formed in the horizontal direction are stacked is possible. Alternatively, a device structure (refer to J. Wan, L. Rojer, A. Zaslavsky, and S. Critoloveanu: "A Compact Capacitor-Less High-Speed DRAM Using Field Effect-Controlled Charge Regeneration", Electron Device Letters, Vol. 35, No. 2, pp. 179-181 (2012), T. Ohsawa, K. Fujita, T. Higashi, Y. Iwata, T. Kajiyama, Y. Asao, and K. Sunouchi: "Memory design using a one-transistor gain cell on SOI", IEEE JSSC, vol. 37, No. 11, pp 1510-1522 (2002), T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond", IEEE IEDM (2006), and E. Yoshida and T. Tanaka: "A Capacitorless 1T-DRAM Technology Using Gate-induced Drain Leakage (GIDL) Current for Low-power and High-speed Embedded Memory", IEEE IEDM, (2006), for example) using a silicon-on-insulator (SOI) is also applicable. In the device structure, a bottom part of a semiconductor base material contacts an insulating layer of an SOI substrate, and another semiconductor base material is surrounded by a gate insulating layer and an element separation insulating layer. In this structure as well, each semiconductor base material has a floating body structure. Thus, the dynamic flash memory element provided by the present embodiment only needs to satisfy a condition that each semiconductor base material has a floating body structure. With a structure in which a fin transistor (refer to H. Jiang, N. Xu, B. Chen, L. Zengl, Y. He, G. Du, X. Liu and X. Zhang: "Experimental investigation of self heating effect (SHE) in multiple-fin SOI FinFETs", Semicond. Sci. Technol. 29 115021 pp. 7 (2014), for example) is formed on an SOI substrate, as well, the dynamic flash memory operation can be performed when a semiconductor base material has a floating body structure.

In FIG. 1, potential distribution of the first semiconductor base material 7a and the second semiconductor base material 7b is continuously formed in a direction vertical to the substrate in the semiconductor base material 7 at a part surrounded by the insulating layer 6. Accordingly, the semiconductor base material 7 as the first semiconductor base material 7a and the second semiconductor base material 7b is continuous in a region surrounded by the insulating layer 6 in the vertical direction.

In FIG. 1, the length of the first gate conductor layer 5a connected to the plate line PL in the vertical direction is desirably longer than the length of the second gate conductor layer 5b connected to the word line WL in the vertical direction to achieve $C_{PL} > C_{WL}$. However, the coupling ratio $(C_{WL}/(C_{PL}+C_{WL}+C_{BL}+C_{SL}))$ of capacitive coupling of the word line WL to the semiconductor base material 7 decreases by adding the plate line PL only. As a result, a potential variation $\Delta V_{FB}$ of the semiconductor base material 7 as a floating body decreases. In the coupling ratio, $C_{SL}$ and $C_{BL}$ are the capacitance of the PN junctions between the semiconductor base material 7 and the N$^+$ layers 3a and 3b as the source and the drain connected to the source line SL and the bit line BL, respectively.

The meaning of "cover" in the description of "a gate insulating layer, a gate conductor layer, or the like covers a channel or the like" in the present specification and the claims includes a case of entirely surrounding as in an SGT and a GAA, a case of partially surrounding as in a fin transistor, and a case of overlapping on a plane as in a planar transistor.

In FIG. 1, the first gate conductor layer 5a may be divided into two or more parts in a plan view or in the vertical direction, and the parts may be operated as conductor electrodes of plate lines in or out of synchronization at the same drive voltage or different drive voltages. Similarly, the second gate conductor layer 5b may be divided into two or more parts in a plan view or in the vertical direction, and the parts may be operated as conductor electrodes of word lines in or out of synchronization at the same drive voltage or different drive voltages. With this configuration as well, the dynamic flash memory operation is performed. In a case where the first gate conductor layer 5a is divided into two or more, at least one of the divided first gate conductor layers functions as the above-described first gate conductor layer 5a. In a case where the second gate conductor layer 5b is divided, at least one of the divided second gate conductor layers functions as the above-described second gate conductor layer 5b. Separated gate conductor layers of one of the first gate conductor layer 5a and the second gate conductor layer 5b may be disposed on both sides of the other of the first gate conductor layer 5a and the second gate conductor layer 5b in the vertical direction.

In FIG. 1, the first gate conductor layer 5a may be connected to the word line WL, and the second gate conductor layer 5b may be connected to the plate line PL. With this configuration as well, the above-described dynamic flash memory operation can be performed. Similarly, the above-described dynamic flash memory operation can be performed irrespective of whether the plate lines PL0 to PL2 or the word lines WL0 to WL2 are provided on the side closer to the bit lines BL0 to BL2 in each memory cell included in the memory block in FIG. 2A.

The above-described condition of voltage applied to each of the bit line BL, the source line SL, the word line WL, and the plate line PL and the voltage of the floating body are examples for performing basic operations of an erase operation, a write operation, a reads operation and may be any other voltage conditions as long as the basic operations of the present invention can be performed.

A junction-less structure is applicable in which the N$^+$ layers 3a and 3b and the semiconductor base material 7 as a P layer have the same conductivity in the dynamic flash memory cell illustrated in FIG. 1. This is the same for any other example.

The present embodiment has the following characteristics.

Characteristic 1

The dynamic flash memory cell according to the first embodiment of the present invention is a non-destructive read-out memory cell. Thus, a page read operation, a page write operation, and a page erase operation can be selectively performed on a memory cell by controlling the voltages of the bit lines BL of individual memory cells connected to the word line WL, the plate line PL, and the source line SL disposed in common. As a result, significant reduction of power consumption and increase in operation speed of a memory operation are achieved. For example, power consumption is reduced to a quarter approximately in a case where a quarter of bit lines included in the memory array are simultaneously subjected to a memory operation as illustrated in FIG. 2J. More specifically, charging-discharging current and a charging-discharging time of bit lines can be significantly reduced. Moreover, not all sense amplifier circuits of the memory array need to operate, and thus reduction of power consumption and increase in operation speed are achieved. This provides a significant advantage to a user of the memory device. Accordingly, a high-speed memory device that is highly reliable with low power consumption can be provided.

Characteristic 2

In the dynamic flash memory cell according to the first embodiment of the present invention, a plurality of memory cells connected in common to wires of a word line, a plate line, and a source line are connected to bit lines different from one another. Thus, a wiring layer physically connected to one word line, one plate line, and one source line can be electrically divided into, for example, four during an operation by controlling the voltages of the bit lines, thereby performing partial activation. As a result, significant reduction of power consumption and increase in operation speed can be achieved in a page read operation, a page write operation, and a page erase operation.

Other Embodiments

Although a Si pillar is formed in the present invention, a semiconductor pillar made of a semiconductor material other than Si may be formed. This is the same for any other embodiment according to the present invention.

In "1" writing, pairs of electrons and holes may be generated by using gate induced drain leakage (GIDL) current disclosed in E. Yoshida and T. Tanaka: "A Capacitorless 1T-DRAM Technology Using Gate-Induced Drain-Leakage (GIDL) Current for Low-Power and High-Speed Embedded Memory", IEEE IEDM (2006), and a floating body FB may be filled with the generated holes. This is the same for any other embodiment according to the present invention.

The dynamic flash memory operation can be performed also with a structure in which the polarity of the conduction type of each of the N$^+$ layers 3a and 3b, the P layer, and the Si pillar 2 in FIG. 1 is inversed. In this case, majority carriers in the N-type Si pillar 2 are electrons. Accordingly, a "1" state is set when electrons generated through impact ionization are stored in the semiconductor base material 7.

A memory block may be formed by two-dimensionally arranging Si pillars of memory cells in a square lattice shape or a rhombic lattice shape. In a case where Si pillars are disposed in a rhombic lattice shape, Si pillars connected to one word line may be disposed in a zigzag shape or a saw shape with a plurality of Si pillars on each side. This is the same for any other embodiment.

The present invention can have various embodiments and modifications without departing from the spirit and scope of the present invention. Each above-described embodiment is only intended to describe an example of the present invention and does not limit the scope of the present invention. Any above-described example and modification may be optionally combined. Some constituent components of the above-described embodiment may be omitted as necessary within the technological idea of the present invention.

With a memory device including a semiconductor element according to the present invention, it is possible to obtain a dynamic flash memory that is a high-density and high-performance memory device including an SGT.

What is claimed is:

1. A memory device including a semiconductor element, the memory device being formed with at least one memory array, the memory array being formed with a plurality of pages and a plurality of bit lines, each page being formed with a plurality of memory cells arranged in a row direction on a substrate in a plan view, the plurality of memory cells being connected to the bit lines disposed in a column direction, wherein
   each of the memory cells included in each of the pages includes:
      a semiconductor base material positioned on the substrate and either standing in a vertical direction or extending in a horizontal direction;
      a first impurity region and a second impurity region positioned in respective ends of the semiconductor base material;
      a gate insulating layer being in contact with a side surface of the semiconductor base material between the first impurity region and the second impurity region;
      a first gate conductor layer at least partially covering the gate insulating layer; and
      a second gate conductor layer positioned adjacent to the first gate conductor layer and being in contact with the side surface of the gate insulating layer, further wherein
   in the memory cell, the first impurity region is connected to a source line, the second impurity region is connected to a corresponding one of the bit lines, one of the first and second gate conductor layers is connected to a word line, and the other is connected to a plate line,
   a page erase operation, a page write operation, and a page read operation are performed by controlling a voltage applied to each of the source line, the bit line, the word line, and the plate line,
   the bit line is connected to a sense amplifier circuit through a switch circuit, and
   at least one of the bit lines and one of the pages are selected in the page erase operation, the page write operation, and the page read operation, and an erase operation on the memory cell connected to both the bit line and the page thus selected, a write operation of storage data of the sense amplifier circuit to the memory cell, or a read operation from the memory cell to the sense amplifier circuit is executed.

2. The memory device including a semiconductor element according to claim 1, wherein the voltage of the bit line when not selected is set to zero volt or a floating state in the page erase operation, the page write operation, and the page read operation.

3. The memory device including a semiconductor element according to claim 1, wherein
   the voltage applied to each of the source line, the bit line, the word line, and the plate line is controlled to execute, in the page erase operation, an operation that decreases the number of holes remaining in the semiconductor base material by annihilating some holes in the semiconductor base material of the memory cell of the page, and
   the voltage applied to each of the source line, the bit line, the word line, and the plate line is controlled to execute, in the page write operation, an operation that increases the number of holes remaining in the semiconductor base material of the selected memory cell of the page through an impact ionization phenomenon.

4. The memory device including a semiconductor element according to claim 1, wherein
   the word line and the plate line are disposed in parallel to each other in a plan view, and
   the bit line is disposed in the vertical direction with respect to the word line and the plate line in a plan view.

5. The memory device including a semiconductor element according to claim 1, wherein a first gate capacitance between the first or second gate conductor layer connected to the plate line and the semiconductor base material is larger than a second gate capacitance between the first or second gate conductor layer connected to the word line and the semiconductor base material.

6. The memory device including a semiconductor element according to claim 1, wherein the source line is separated for each of the memory cells arranged in the column direction in a plan view and is disposed in parallel to the word line and the plate line.

7. The memory device including a semiconductor element according to claim 1, wherein the source line is connected in common to all of the memory cells of the pages adjacent to each other in a plan view.

8. The memory device including a semiconductor element according to claim 1, wherein the semiconductor base material is a P-type semiconductor layer, and the first impurity region and the second impurity region are N-type semiconductor layers.

9. The memory device including a semiconductor element according to claim 1, wherein in the page erase operation, all of the memory cells connected to at least two pairs of the pages are erased.

10. The memory device including a semiconductor element according to claim 1, wherein the word line and the plate line are connected to a row decoder circuit, a row address is input to the row decoder circuit, and the page is selected in accordance with the row address.

11. The memory device including a semiconductor element according to claim 1, wherein the first or second gate conductor layer connected to the plate line is divided in a channel direction into a plurality of parts.

12. The memory device including a semiconductor element according to claim 1, wherein one or both of the first and second gate conductor layers are divided into two or more separated gate conductor layers in a plan view or in the vertical direction, and the separated gate conductor layers are operated in or out of synchronization.

13. The memory device including a semiconductor element according to claim 12, wherein the separated gate conductor layers of one of the first and second gate conductor layers are disposed on both sides of the other gate conductor layer in the vertical direction.

* * * * *